United States Patent
Doczy et al.

(10) Patent No.: US 10,395,707 B2
(45) Date of Patent: Aug. 27, 2019

(54) AMORPHOUS SEED LAYER FOR IMPROVED STABILITY IN PERPENDICULAR STTM STACK

(71) Applicant: Intel Corporation, Santa Clara, CA (US)

(72) Inventors: Mark L. Doczy, Portland, OR (US); Kaan Oguz, Hillsboro, OR (US); Brian S. Doyle, Portland, OR (US); Charles C. Kuo, Hillsboro, OR (US); Robert S. Chau, Beaverton, OR (US); Satyarth Suri, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/503,359

(22) PCT Filed: Sep. 26, 2014

(86) PCT No.: PCT/US2014/057865
§ 371 (c)(1),
(2) Date: Feb. 10, 2017

(87) PCT Pub. No.: WO2016/048376
PCT Pub. Date: Mar. 31, 2016

(65) Prior Publication Data
US 2017/0345476 A1    Nov. 30, 2017

(51) Int. Cl.
*H01L 43/10* (2006.01)
*H01L 43/12* (2006.01)
(Continued)

(52) U.S. Cl.
CPC ........ *G11C 11/161* (2013.01); *H01F 10/3286* (2013.01); *H01L 27/222* (2013.01); *H01L 43/10* (2013.01); *H01L 43/12* (2013.01)

(58) Field of Classification Search
CPC ............... G11C 11/16; G11C 11/161; G11C 11/14–1697; G11C 11/5607;
(Continued)

(56) References Cited

U.S. PATENT DOCUMENTS

| 5,599,632 A | 2/1997 | Cheng et al. |
| 2006/0017081 A1 | 1/2006 | Jijun et al. |

(Continued)

OTHER PUBLICATIONS

Intel Corporation, Search Report and Written Opinion, PCT Application No. PCT/US2014/057865 (dated May 28, 2015).
(Continued)

*Primary Examiner* — Selim U Ahmed
(74) *Attorney, Agent, or Firm* — Schwabe, Williamson & Wyatt, P.C.

(57) ABSTRACT

A material layer stack for a magnetic tunneling junction, the material layer stack including a fixed magnetic layer; a dielectric layer; a free magnetic layer; and an amorphous electrically-conductive seed layer, wherein the fixed magnetic layer is disposed between the dielectric layer and the seed layer. A non-volatile memory device including a material stack including an amorphous electrically-conductive seed layer; and a fixed magnetic layer juxtaposed and in contact with the seed layer. A method including forming an amorphous seed layer on a first electrode of a memory device; forming a material layer stack on the amorphous seed layer, the material stack including a dielectric layer disposed between a fixed magnetic layer and a free magnetic layer, wherein the fixed magnetic layer.

20 Claims, 5 Drawing Sheets

(51) Int. Cl.
  *G11C 11/16* (2006.01)
  *H01F 10/32* (2006.01)
  *H01L 27/22* (2006.01)

(58) Field of Classification Search
  CPC ............ G11C 14/0036; G11C 14/0045; G11C 14/0081; G11C 19/02–10; G11C 19/14; H01L 43/12; H01L 43/10; H01L 27/222–228; H01L 21/8246; H01L 29/82; H01L 43/02; H01L 29/66984; H01L 29/94; H01L 43/143; H01F 10/3286; H01F 10/32–3295; H03B 15/006; G11B 5/00; Y10S 977/933–935; G02F 2203/16
  See application file for complete search history.

(56) References Cited

U.S. PATENT DOCUMENTS

| | | |
|---|---|---|
| 2011/0318848 A1 | 12/2011 | Choi et al. |
| 2013/0052483 A1 | 2/2013 | Tahmasebi et al. |
| 2013/0177781 A1* | 7/2013 | Chepulskyy .......... G11C 11/161 428/811.1 |
| 2014/0027869 A1 | 1/2014 | Lee et al. |
| 2014/0033516 A1 | 2/2014 | Abraham et al. |
| 2014/0103469 A1* | 4/2014 | Jan .......................... H01L 43/10 257/421 |
| 2015/0340598 A1* | 11/2015 | Gan ....................... H01L 43/08 257/421 |

OTHER PUBLICATIONS

Intel Corporation, "International Preliminary Report on Patentability and Written Opinion", PCT Application No. PCT/US2014/057865, (dated Mar. 28, 2017).

Search Report for European Patent Application No. 14902854.0 dated May 9, 2018, 8 pages.

\* cited by examiner

US 10,395,707 B2

AMORPHOUS SEED LAYER FOR IMPROVED STABILITY IN PERPENDICULAR STTM STACK

CROSS-REFERENCE TO RELATED APPLICATION

This patent application is a U.S. National Phase Application under 35 U.S.C. § 371 of International Application No. PCT/US2014/057865, filed Sep. 26, 2014, entitled AMORPHOUS SEED LAYER FOR IMPROVED STABILITY PERPENDICULAR STTM STACK.

BACKGROUND

Field

Memory devices and, in particular, spin transfer torque memory (STTM) devices.

Description of Related Art

The scaling of features in integrated circuits has been a driving force behind an ever-growing semiconductor industry. Scaling to smaller and smaller features generally enables increased densities of functional units on the limited real estate of semiconductor chips. For example, shrinking transistor size allows for the incorporation of an increased number of memory devices on a chip, lending to the fabrication of products with increased capacity. The drive for ever-more capacity, however, is not without issue. The necessity to optimize the performance of each device becomes increasingly significant.

The operation of spin torque devices is based on the phenomenon of spin transfer torque. If a current is passed through a magnetization layer, called the fixed magnetic layer, it will be spin polarized. With the passing of each electron, its spin (angular momentum) will be transferred to the magnetization in the next magnetic layer, called the free magnetic layer, and will cause a small change on the magnetization of such next layer. This is, in effect, a torque-causing precession of magnetization. Due to reflection of electrons, a torque is also exerted on the magnetization of an associated fixed magnetic layer. In the end, if the current exceeds a certain critical value (given by damping caused by the magnetic material and its environment), the magnetization of the free magnetic layer will be switched by a pulse of current, typically in about one to tens nanoseconds. Magnetization of the fixed magnetic layer may remain unchanged since an associated current is below its threshold due to geometry or due to an adjacent anti-ferromagnetic layer.

Spin-transfer torque can be used to flip the active elements in magnetic random access memory. Spin-transfer torque memory, or STTM, has the advantages of lower power consumption and better scalability over conventional magnetic random access memory (MRAM) which uses magnetic fields to flip the active elements. However, significant improvements are still needed in the area of STTM device manufacture and usage.

DETAILED DESCRIPTION

Spin transfer torque memory (STTM) devices and memory arrays with enhanced stability and methods of fabricating STTM devices and memory arrays with enhanced stability are described. In the following description, numerous specific details are set forth, such as specific magnetic layer integration and material regimes, in order to provide a thorough understanding of embodiments. It will be apparent to one skilled in the art that embodiments may be practiced without these specific details. In other instances, well-known features, such as integrated circuit design layouts, are not described in detail in order to not unnecessarily obscure embodiments. Furthermore, it is to be understood that the various embodiments shown in the figures are illustrative representations and are not necessarily drawn to scale.

One or more embodiments are directed to methodologies for increasing stability in perpendicular STTM systems. Applications may include use in embedded memory, embedded non-volatile memory (NVM), magnetic random access memory (MRAM), magnetic tunnel junction (MTJ) devices, NVM, perpendicular MTJ, STTM, and non-embedded or stand-alone memories. In an embodiment, stability in perpendicular STTM devices is achieved by including an amorphous, electrically-conducting seed layer juxtaposed and in contact with a fixed free magnetic layer, as is described in greater detail below.

Stability is an issue facing scaling of STTM based devices and memory arrays fabricated therefrom. As scaling continues, the need for smaller memory elements to fit into a scaled cell size has driven the industry in the direction of perpendicular STTMs, which have higher stability for small memory element sizes. Common perpendicular STTMs are achieved by three approaches, all of which rely on interface tuning to derive a maximum amount of perpendicular strength and, hence, stability from a material stack that includes magnetic layers.

Figure 1:
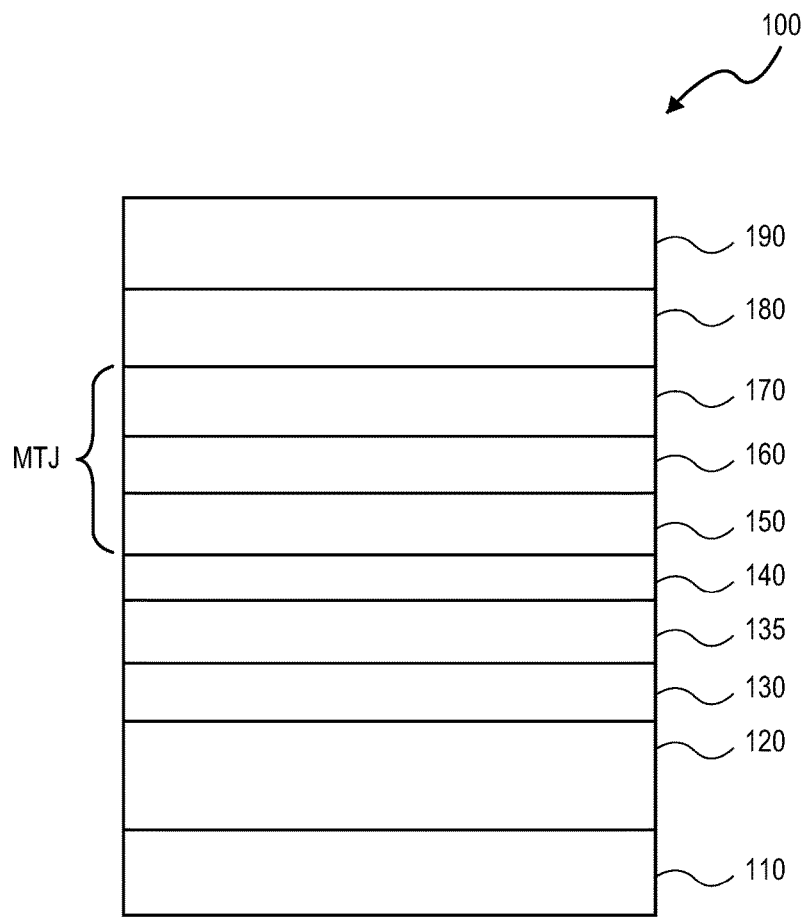
FIG. 1 shows a cross-sectional view of a material layer stack for an embodiment of a spin transfer torque memory (STTM) device.

FIG. 1 illustrates a cross-sectional view of an embodiment of a material layer stack for a conventional spin transfer torque memory (STTM) device. The various layers of the memory stack will be described from bottom to top (as viewed) with each subsequent layer juxtaposed and in contact with the previously described layer. The memory stack is illustrated as multiple layers each having a rectangular shape. It is appreciated that a cross-sectional shape of a layer can representatively depend on, among other things, a material property, an introduction technique and/or tool, and a shape (e.g., surface) of any underlying layer. Therefore, an illustration as a rectangular shape should be broadly interpreted to include other possible cross-sectional shapes including, but not limited to, trapezoidal, a parallelogram, or other polygonal shape.

Referring to FIG. 1, material layer stack 100 includes amorphous conductive layer 110 of, for example, tantalum. Juxtaposed and in contact with amorphous conductive layer 110 is first electrode 120. In one embodiment, first electrode 120 is a ruthenium material that has a crystalline form. On or overlying first electrode 120 is electrically conductive layer 130 of, for example, a non-ferromagnetic material such as tantalum that has a crystalline form. On conductive layer 130 is synthetic antiferromagnet (SAF) 135. Representatively SAF 135 is made up of cobalt-platinum heterostructure layers separated by a ruthenium layer. Without wishing to be bound by theory, for a perpendicular memory stack, an SAF based on a cobalt-platinum heterostructures coupled by a ruthenium layer though an RKKY interaction means cobalt-platinum heterostructures on opposing sides of the ruthenium layer will tend to have perpendicular magnetic moments but in opposite directions.

On SAF 135 is seed layer 140. Details about seed layer 140 are discussed below. On seed layer 140 is fixed magnetic layer 150, dielectric layer or spin filter 160, and free magnetic layer 170 that, in this embodiment, collectively characterize a magnetic tunnel junction (MTJ) portion of material layer stack 100. In one embodiment, a material of fixed magnetic layer 150 and a material of free magnetic layer 170 are each cobalt-iron-boron (CoFeB). In one embodiment, dielectric layer 160 is an oxide such as magnesium oxide (MgO). On or overlying the MTJ (specifically on free magnetic layer 170), in this embodiment, is conductive layer 180 of a non-ferromagnetic material such as tantalum followed by second electrode 190 of, for example, a rutherium material.

In one embodiment, material stack 100 is fabricated to provide a perpendicular magnetic anisotropy. In one embodiment, referring again to the features of material stack 100 as a platform, free magnetic layer 170 composed of CoFeB has a thickness such that a perpendicular component obtained from the iron/cobalt (Fe/Co) in free magnetic layer 170 interacts with oxygen in dielectric layer 160 (e.g., interacting with a magnesium oxide (MgO) layer 160 at an interface of the layers or films) dominates over an in-plane component of free CoFeB layer 170. A representative thickness of free magnetic layer 170 is less than two nanometers, for example, one nanometer. In one embodiment of a material stack suitable to provide perpendicular anisotropy, fixed magnetic layer 150 of, for example, CoFeB, has a thickness of less than two nanometers, for example, one nanometer.

In the embodiments described above, a thickness of fixed material layer 150 and/or free magnetic layer 170 are relatively thin (less than two nanometers). A measure of a stability of a perpendicular STTM device is a value of an anisotropy energy constant, Ki, with a higher value indicating increased stability. A stability (Ki) of a perpendicular stack will depend, in one aspect, on the interface between magnetic layers (a CoFeB layer) with the dielectric layer (MgO layer). In one embodiment, seed layer 140 at an interface with fixed magnetic layer 150 of the MTJ portion has an amorphous form.

Juxtaposing fixed magnetic layer 150 adjacent and in contact with seed layer 140 having an amorphous orientation tends to increase the stability of a perpendicular memory stack because such seed layer tends to be smoother or flatter than a layer having a crystalline orientation. While not wishing to be bound by theory, it is believed that the smooth/flat amorphous seed layer 140 allows fixed magnetic layer 150 to be smooth/flat which encourages perpendicular oriented vectors between fixed magnetic layer 150 and oxide layer 160.

In the above embodiment, seed layer 140 juxtaposed and in contact with fixed magnetic layer 150 in stack 100 has an amorphous form. Suitable materials for seed layer 140 include a non-ferromagnetic metal material, a carbon material, or a metal glass material A representative thickness of seed layer 140 is limited, in one embodiment, to a thickness that will allow a magnetic coupling between SAF 135 and fixed magnetic layer 150. In one embodiment, a representative thickness of seed layer 140 is less than 2 nanometers. In a particular embodiment, seed layer 140 is on the order of 5 angstroms (Å) to 25 Å. Seed layer 140 may be a single material. Alternatively, seed layer 140 may be composed of multiple materials (e.g., multiple layers or a combination where distinct layers may not be readily identifiable). Representatively, where conductive layer 130 has a crystalline form, deposited material on (in contact with) conductive layer 130 may tend to adopt the crystalline form. In one embodiment, a first material may be introduced on conductive layer 130 followed by a second material that has an amorphous form that is dominant over a crystalline form of the first material where collectively the first material and the second material comprise seed layer 140. In one embodiment, the first material of, for example, CoFeB may adopt a crystalline form from its contact with conductive layer 130. The second material of seed layer 140 has an amorphous form and transitions a crystalline form to an amorphous form so that a surface of seed layer 140 juxtaposed to fixed magnetic layer 150 has an amorphous form. Representatively, a second material is tantalum.

In the above embodiment of a material layer stack for an STTM device described a fixed magnetic layer adjacent a seed layer. In another embodiment, the free and fixed magnetic layers can be reversed and a free magnetic layer is adjacent the seed layer (e.g., free magnetic layer is juxtaposed and in contact with a seed layer such as seed layer 140 in FIG. 1). In accordance with such embodiment, the SAF is disposed adjacent the fixed magnetic layer so that in the stack the fixed magnetic layer is disposed between the dielectric layer or spin filter and the SAF.

In certain aspects and at least some embodiments, certain terms hold certain definable meanings. For example, a "free" magnetic layer is a magnetic layer storing a computational variable. A "fixed" magnetic layer is a magnetic layer with fixed magnetization (magnetically harder than the free magnetic layer). A tunneling barrier, such as a tunneling dielectric or tunneling oxide, is one located between free and fixed magnetic layers. A fixed magnetic layer may be patterned to create inputs and outputs to an associated circuit. Magnetization may be written by spin transfer torque effect while passing a current through the input electrodes. Magnetization may be read via the tunneling magneto-resistance effect while applying voltage to the output electrodes. In an embodiment, the role of the dielectric layer 208 is to cause a large magneto-resistance ratio. The magneto-resistance is the ratio of the difference between resistances when the two ferromagnetic layers have anti-parallel magnetizations and the resistance of the state with the parallel magnetizations.

Methods of fabricating the stack of layers 100 for, e.g., a spin transfer torque memory bit cell may include standard microelectronic fabrication processes such as lithography, etch, thin films deposition, planarization (such as chemical mechanical polishing (CMP)), diffusion, metrology, the use of sacrificial layers, the use of etch stop layers, the use of planarization stop layers, and/or any other associated action with microelectronic component fabrication.

Figure 2:
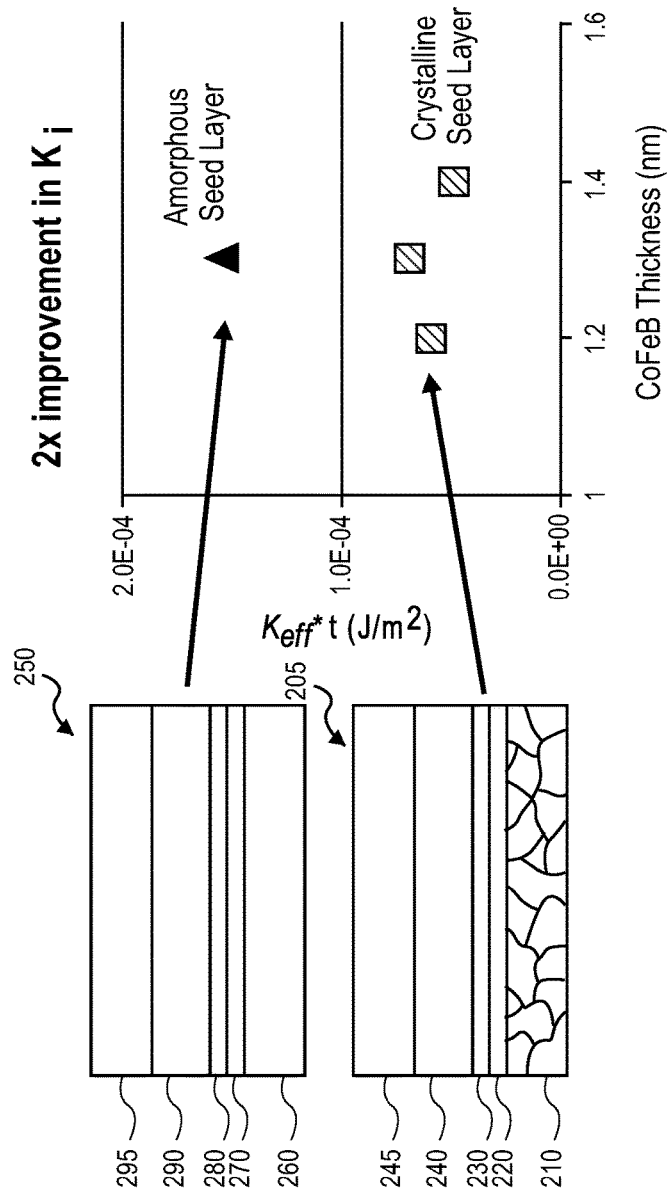
FIG. 2 shows an anisotropy energy constant for a partial magnetic tunnel junction stack having an underlying crystalline form and one having an amorphous form of a given thickness.

FIG. 2 shows an anisotropy energy constant, Ki, for a partial MTJ stack having an underlying crystalline and one with an underlying amorphous conductive film of given thickness. FIG. 2 shows structure 205 including seed layer 210 that is a crystalline film of, for example, tantalum (e.g., Ta (110)). Seed layer 210 is the partial MTJ consisting of fixed magnetic layer 210 of CoFeB and dielectric layer 230 of MgO. Overlying the partial MTJ is conductive layer 240 of tantalum followed by electrode 245 of ruthenium. As illustrated, seed layer 210 of a crystalline tantalum has a crystalline form that is illustrated as grains with a number of grain boundaries that tend to add to a surface roughness of the layer (roughness at an interface with fixed magnetic layer 210). FIG. 2 also shows structure 215 including seed layer 260 of an amorphous tantalum film. Overlying seed layer 260 is a partial MTJ including fixed magnetic layer 270 of CoFeB and dielectric layer 280 of MgO. Overlying the partial MTJ is conductive layer 290 of tantalum followed by electrode 295 of ruthenium. Because seed layer 260 is amorphous, an interface with fixed magnetic layer 270 tends to be smooth.

Adjacent each structure in FIG. 2 is a plot showing the perpendicular magnetic anisotropy for each stack as a function of fixed magnetic layer thickness. As illustrated, for a fixed magnetic layer thickness on the order of about 1.3 nanometers, structure 250 including the amorphous seed layer underlying fixed magnetic layer 270 has an approximately 2× improvement in its effective perpendicular magnetic anisotropy over structure 205 where seed layer 210 underlying fixed magnetic layer 220 is crystalline.

Figure 3:
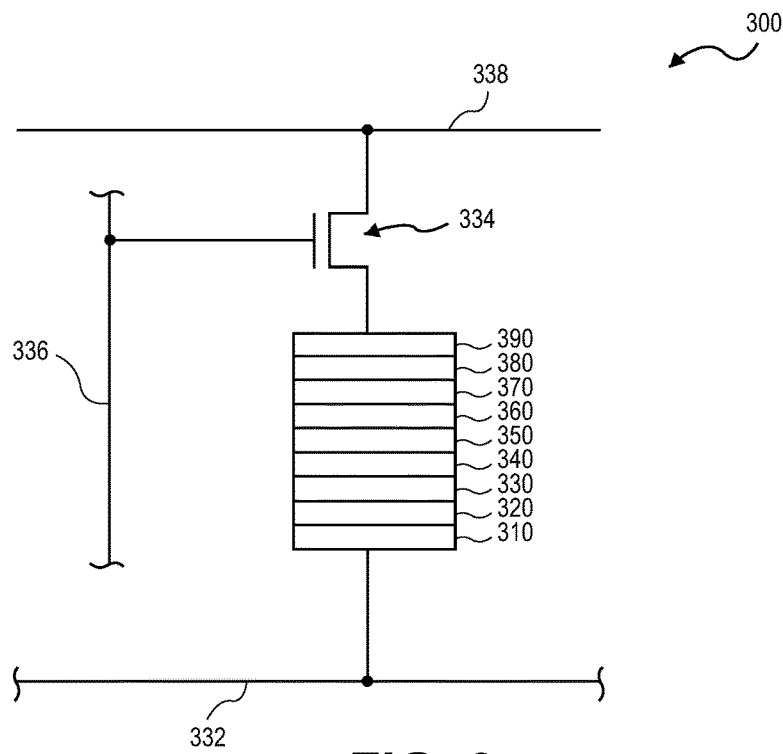
FIG. 3 illustrates a schematic of a spin transfer torque memory bit cell which includes a spin transfer torque element, in accordance with an embodiment.

A stack of layers including magnetic material layers and a conductive oxide layer, e.g., which are used in a magnetic tunneling junction such as shown in FIG. 1 may be used to fabricate as memory bit cell. FIG. 3 illustrates a schematic of a spin transfer torque memory bit cell 300 which includes a spin transfer torque element 305.

Referring to FIG. 3, cell 305 includes a material stack of amorphous conductive layer 310 of, for example, tantalum; first electrode 320 of, for example, ruthenium; conductive layer 330 of, for example, tantalum; seed layer 340 of, for example, graphite or a metal oxide; fixed magnetic layer 350 of CoFeB; dielectric layer 360 of MgO; free magnetic layer 370 of CoFeB; conductive layer 380 of, for example, tantalum; and second electrode 190 of, for example, ruthenium.

In an embodiment, spin transfer torque element 305 is based on perpendicular magnetism. First electrode 320 may be electrically connected to a bit line 332. Second electrode 390 may be coupled with a transistor 334. Transistor 334 may be connected with word line 336 and source line 338 in a manner that will be understood to those skilled in the art. Spin transfer torque memory bit cell 300 may further include additional read and write circuitry (not shown), a sense amplifier (not shown), a bit line reference (not shown), and the like, as will be understood by those skilled in the art, for the operation of the spin transfer torque memory bit cell 300. It is to be understood that a plurality of the spin transfer torque memory bit cells 300 may be operably connected to one another to form a memory array (not shown), wherein the memory array can be incorporated into a non-volatile memory device. It is to be understood that the transistor 334 may be connected to the fixed magnetic layer electrode 316 or the free magnetic layer electrode 312, although only the latter is shown.

Figure 4:
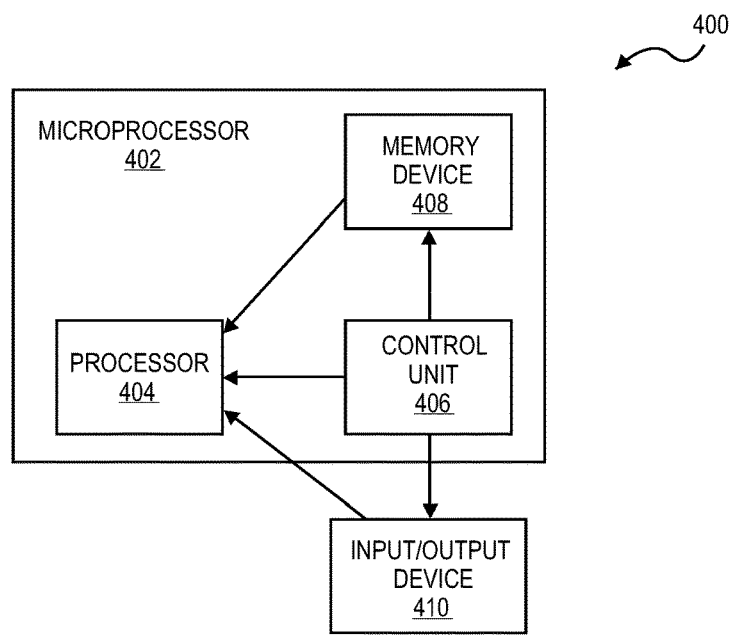
FIG. 4 illustrates a block diagram of an electronic system, in accordance with an embodiment.

FIG. 4 illustrates a block diagram of electronic system 400, in accordance with an embodiment. Electronic system 400 can correspond to, for example, a portable system, a computer system, a process control system, or any other system that utilizes a processor and an associated memory. Electronic system 400 may include microprocessor 402 (having processor 404 and control unit 406), memory device 408, and input/output device 410 (it is to be understood that electronic system 400 may have a plurality of processors, control units, memory device units and/or input/output devices in various embodiments). In one embodiment, electronic system 400 has a set of instructions that define operations which are to be performed on data by processor 404, as well as, other transactions between processor 404, memory device 408, and input/output device 410. Control unit 406 coordinates the operations of processor 404, memory device 408 and input/output device 410 by cycling through a set of operations that cause instructions to be retrieved from memory device 408 and executed. Memory device 408 can include memory bit cells as described above. In an embodiment, memory device 408 is embedded in microprocessor 402, as depicted in FIG. 4.

Figure 5:
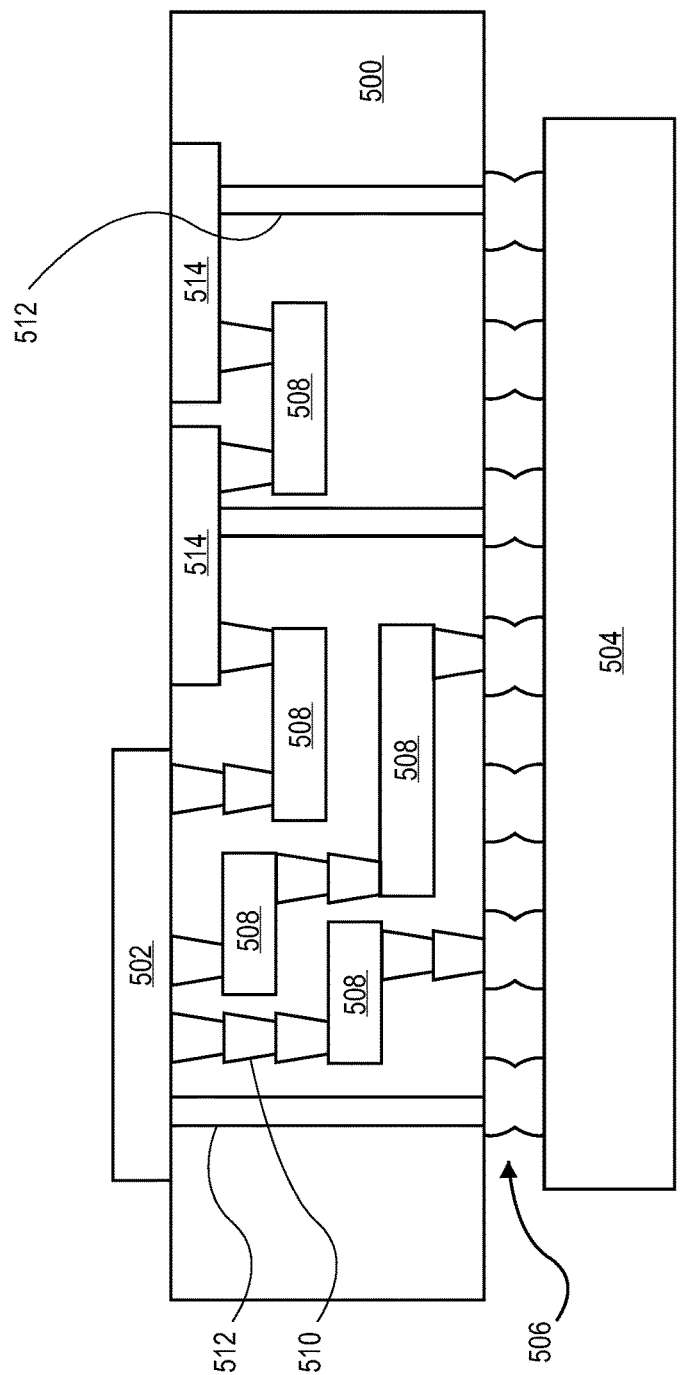
FIG. 5 is an interposer implementing one or more embodiments.

FIG. 5 illustrates interposer 500 that includes one or more embodiments. Interposer 500 is an intervening substrate used to bridge first substrate 502 to second substrate 504. First substrate 502 may be, for instance, an integrated circuit die. Second substrate 504 may be, for instance, a memory module, including memory bit cells as described above. Generally, the purpose of interposer 500 is to spread a connection to a wider pitch or to reroute a connection to a different connection. For example, interposer 500 may couple an integrated circuit die to ball grid array (BGA) 506 that can subsequently be coupled to second substrate 504. In some embodiments, first and second substrates 502/504 are attached to opposing sides of interposer 500. In other embodiments, first and second substrates 502/504 are attached to the same side of interposer 500. And in further embodiments, three or more substrates are interconnected by way of interposer 500.

Interposer 500 may be formed of an epoxy resin, a fiberglass-reinforced epoxy resin, a ceramic material, or a polymer material such as polyimide. In further implementations, the interposer may be formed of alternate rigid or flexible materials that may include the same materials described above for use in a semiconductor substrate, such as silicon, germanium, and other group III-V and group IV materials.

The interposer may include metal interconnects 508 and vias 510, including but not limited to through-silicon vias (TSVs) 512. Interposer 500 may further include embedded devices 514, including both passive and active devices. Such devices include, but are not limited to, capacitors, decoupling capacitors, resistors, inductors, fuses, diodes, transformers, sensors, and electrostatic discharge (ESD) devices. More complex devices such as radio-frequency (RF) devices, power amplifiers, power management devices, antennas, arrays, sensors, and MEMS devices may also be formed on interposer 500.

In accordance with embodiments, apparatuses or processes disclosed herein may be used in the fabrication of interposer 500.

Figure 6:
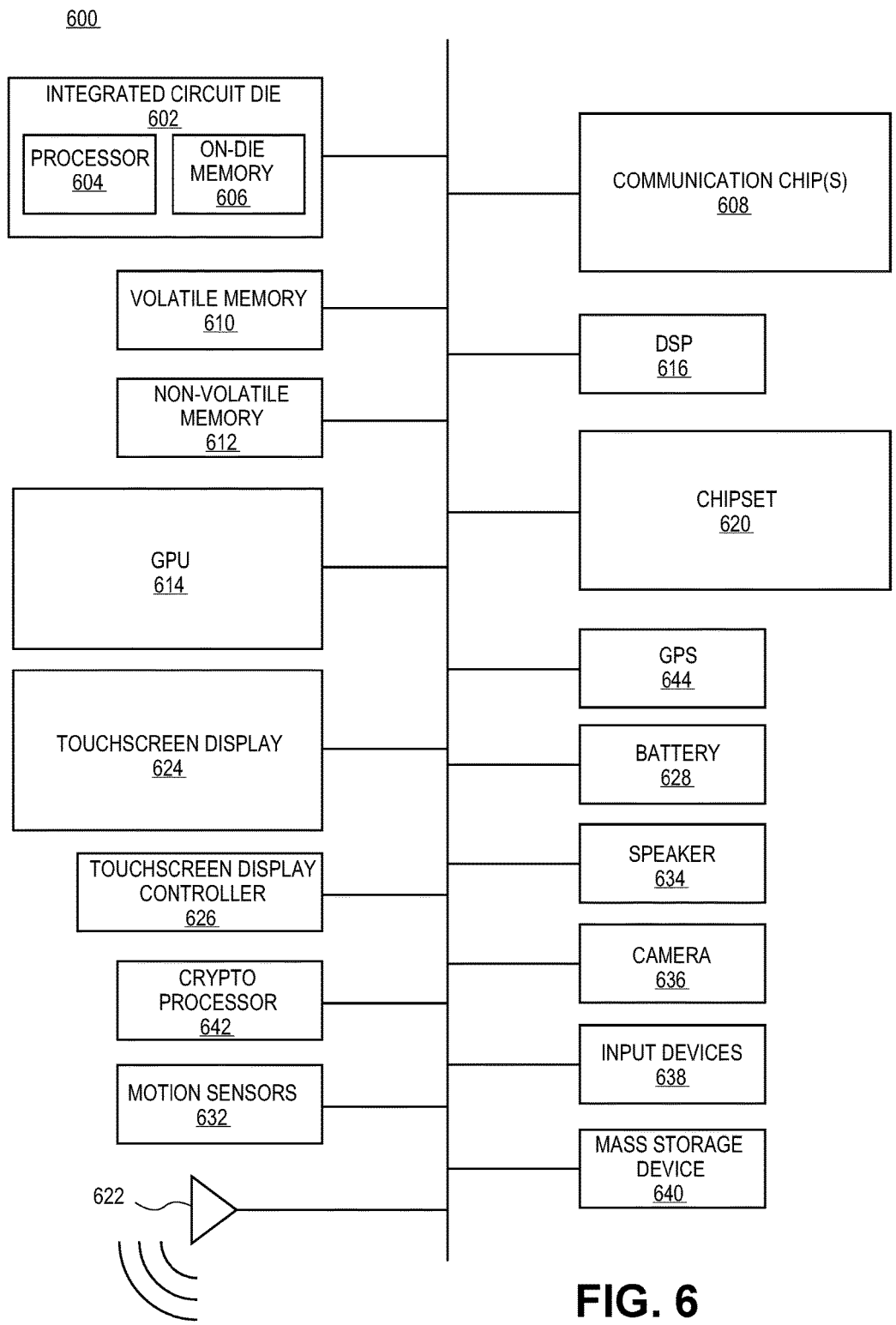
FIG. 6 illustrates an embodiment of a computing device.

FIG. 6 illustrates computing device 600 in accordance with one embodiment. Computing device 600 may include a number of components. In one embodiment, these components are attached to one or more motherboards. In an alternate embodiment, these components are fabricated onto a single system-on-a-chip (SoC) die rather than a motherboard. The components in computing device 600 include, but are not limited to, integrated circuit die 602 and at least one communication chip 608. In some implementations communication chip 608 is fabricated as part of integrated circuit die 602. The integrated circuit die 602 may include CPU 604 as well as on-die memory 606, often used as cache memory, that can be provided by spin-transfer torque memory including cells as described above including a material stack of an amorphous conductive seed layer juxtaposed and in contact with a fixed magnetic layer.

Computing device 600 may include other components that may or may not be physically and electrically coupled to the motherboard or fabricated within an SoC die. These other components include, but are not limited to, volatile memory 610 (e.g., STTM or STTM-RAM with cells as described above), non-volatile memory 612 (e.g., ROM or flash memory), graphics processing unit 614 (GPU), digital signal processor 616, crypto processor 642 (a specialized processor that executes cryptographic algorithms within hardware), chipset 620, antenna 622, display or touchscreen display 624, touchscreen controller 626, battery 628 or other power source, a power amplifier (not shown), global positioning system (GPS) device 644, compass 630, motion coprocessor or sensors 632 (that may include an accelerometer, a gyroscope, and a compass), speaker 634, camera 636, user input devices 638 (such as a keyboard, mouse, stylus, and touchpad), and mass storage device 640 (such as hard disk drive, compact disk (CD), digital versatile disk (DVD), and so forth).

Communications chip 608 enables wireless communications for the transfer of data to and from computing device 600. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 608 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. Computing device 600 may include a plurality of communication chips 608. For instance, first communication chip 608 may be dedicated to shorter range wireless communications such as Wi-Fi and Bluetooth and second communication chip 608 may be dedicated to longer range wireless communications such as GPS, EDGE, GPRS, CDMA, WiMAX, LTE, Ev-DO, and others.

Processor 604 of computing device 600 includes one or more devices, such as transistors or metal interconnects. The term "processor" may refer to any device or portion of a device that processes electronic data from registers and/or memory to transform that electronic data into other electronic data that may be stored in registers and/or memory.

Communication chip 608 may also include one or more devices, such as transistors or metal interconnects, that are formed in accordance with embodiments.

In various embodiments, computing device 600 may be a laptop computer, a netbook computer, a notebook computer, an ultrabook computer, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, computing device 600 may be any other electronic device that processes data.

EXAMPLES

Example 1 is a material layer stack for a magnetic tunneling junction, the material layer stack including a fixed magnetic layer; a dielectric layer; a free magnetic layer; and an amorphous electrically-conductive seed layer, wherein the dielectric layer is disposed between the fixed magnetic layer and the free magnetic layer and the fixed magnetic layer is disposed between the dielectric layer and the seed layer.

In Example 2, the fixed magnetic layer in the material layer stack of Example 1 includes cobalt-iron-boron (CoFeB).

In Example 3, the material layer stack of Example 1 has perpendicular magnetic anisotropy.

In Example 4, the fixed magnetic layer of Example 3 includes CoFeB and a thickness of less than 2 nanometers.

In Example 5, the seed layer in the material stack of Example 1 includes a first material and a second material.

In Example 6, the first material of Example 5 includes CoFeB and the second material includes tantalum disposed between the first material and fixed magnetic layer.

In Example 7, the seed layer in the material stack of any of Examples 1, 2, 3 or 5 includes carbon.

In Example 8, the seed layer in the material stack of any of Examples 1, 2, 3 or 5 includes a metal glass material.

Example 9 is a non-volatile memory device including a material stack including an amorphous electrically-conductive seed layer; a fixed magnetic layer juxtaposed and in contact with the seed layer; a dielectric layer disposed between the fixed magnetic layer and a free magnetic layer; a first electrode disposed on a first side of the material stack; a second electrode disposed on a second side of the material stack; and a transistor device coupled to one of the top electrode or the bottom electrode.

In Example 10, the fixed magnetic layer in the stack of the memory device of Example 9 includes cobalt-iron-boron (CoFeB).

In Example 11, the stack in the memory device of Example 10 has perpendicular magnetic anisotropy.

In Example 12, the fixed magnetic layer in the stack of the memory device of Example 11 includes a thickness of less than 2 nanometers.

In Example 13, the seed layer in the stack of the memory device of Example 9 includes a first material and a second material.

In Example 14, the first material in the memory device of Example 13 includes CoFeB and the second material includes tantalum disposed between the first material and fixed magnetic layer.

In Example 15, the seed layer in the stack of the memory device of any of Examples 9 or 10 includes carbon or a metal glass material.

In Example 16, the second side of the material stack in the memory device of any of Examples 9 or 10 is opposite the first side.

Example 17 is a method including forming an amorphous seed layer on a first electrode of a memory device; forming a material layer stack on the amorphous seed layer, the material stack including a dielectric layer disposed between a fixed magnetic layer and a free magnetic layer, wherein the fixed magnetic layer is juxtaposed and in contact with the seed layer; and forming a second electrode on the material stack.

In Example 18, the stack in the method of Example 17 has perpendicular magnetic anisotropy.

In Example 19, forming the material stack in the method of Example 18 includes forming the fixed magnetic layer to a thickness less than 2 nanometers.

In Example 20, the fixed magnetic layer in the method of Example 19 includes cobalt-iron-boron (CoFeB).

In Example 21, a nonvolatile memory device is made by any of the methods of Examples 17-20.

In Example 22, each of an array of memory devices is made by any of the methods of Examples 17-20.

The above description of illustrated implementations, including what is described in the Abstract, is not intended to be exhaustive or to limit the invention to the precise forms disclosed. While specific implementations of, and examples for, the invention are described herein for illustrative purposes, various equivalent modifications are possible within the scope of the invention, as those skilled in the relevant art will recognize.

These modifications may be made to the invention in light of the above detailed description. The terms used in the following claims should not be construed to limit the invention to the specific implementations disclosed in the specification and the claims. Rather, the scope of the invention is to be determined entirely by the following claims, which are to be construed in accordance with established doctrines of claim interpretation.

The invention claimed is:

1. A material layer stack for a magnetic tunneling junction, the material layer stack comprising:
   a fixed magnetic layer;
   a dielectric layer;
   a free magnetic layer;
   an amorphous electrically-conductive seed layer, wherein the dielectric layer is disposed between the fixed magnetic layer and the free magnetic layer and the fixed magnetic layer is disposed between the dielectric layer and the seed layer, and wherein the fixed magnetic layer is in direct contact with the dielectric layer and is in direct contact with the seed layer; and
   a synthetic antiferromagnet (SAF) layer, wherein the amorphous electrically-conductive seed layer is on and in direct contact with the SAF layer, and wherein the SAF layer is separate and distinct from the amorphous electrically-conductive seed layer.

2. The material layer stack of claim 1, wherein the fixed magnetic layer comprises cobalt-iron-boron (CoFeB).

3. The material layer stack of claim 1, wherein the stack has perpendicular magnetic anisotropy.

4. The material layer stack of claim 3, wherein the fixed magnetic layer comprises CoFeB and a thickness of less than 2 nanometers.

5. The material layer stack of claim 1, wherein the seed layer comprises a first material and a second material.

6. The material layer stack of claim 5, wherein the first material comprises CoFeB and the second material comprises tantalum disposed between the first material and fixed magnetic layer.

7. The material layer stack of claim 1, wherein the seed layer comprises carbon.

8. The material layer stack of claim 1, wherein the seed layer comprises a metal glass material.

9. A non-volatile memory device comprising:
   a material stack comprising:
   an amorphous electrically-conductive seed layer;
   a fixed magnetic layer juxtaposed and in direct contact with the seed layer;
   a dielectric layer disposed between the fixed magnetic layer and a free magnetic layer, the dielectric layer in direct contact with the fixed magnetic layer;
   a synthetic antiferromagnet (SAF) layer, wherein the amorphous electrically-conductive seed layer is on and in direct contact with the SAF layer, and wherein the SAF layer is separate and distinct from the amorphous electrically-conductive seed layer;
   a first electrode disposed on a first side of the material stack;
   a second electrode disposed on a second side of the material stack; and
   a transistor device coupled to one of the top electrode or the bottom electrode.

10. The memory device of claim 9, wherein the fixed magnetic layer comprises cobalt-iron-boron (CoFeB).

11. The memory device of claim 10, wherein the stack has perpendicular magnetic anisotropy.

12. The memory device of claim 11, wherein the fixed magnetic layer comprises a thickness less than 2 nanometers.

13. The memory device of claim 9, wherein the seed layer comprises a first material and a second material.

14. The memory device of claim 13, wherein the first material comprises CoFeB and the second material comprises tantalum disposed between the first material and fixed magnetic layer.

15. The memory device of claim 9, wherein the seed layer comprises carbon or a metal glass material.

16. The memory device of claim 9, wherein the second side of the material stack is opposite the first side.

17. A method comprising:
   forming an amorphous seed layer on and in direct contact with a synthetic antiferromagnet (SAF) layer on a first electrode of a memory device, wherein the SAF layer is separate and distinct from the amorphous electrically-conductive seed layer;
   forming a material layer stack on the amorphous seed layer, the material stack comprising a dielectric layer disposed between a fixed magnetic layer and a free magnetic layer, the dielectric layer in direct contact with the fixed magnetic layer, wherein the fixed magnetic layer is juxtaposed and in direct contact with the seed layer; and
   forming a second electrode on the material stack.

18. The method of claim 17, wherein the stack has perpendicular magnetic anisotropy.

19. The method of claim 18, wherein forming the material stack comprises forming the fixed magnetic layer to a thickness less than 2 nanometers.

20. The method of claim 19, wherein the fixed magnetic layer comprises cobalt-iron-boron (CoFeB).

* * * * *